United States Patent
Gluschenkov et al.

(10) Patent No.: US 9,972,682 B2
(45) Date of Patent: May 15, 2018

(54) LOW RESISTANCE SOURCE DRAIN CONTACT FORMATION

(71) Applicants: International Business Machines Corporation, Armonk, NY (US); GLOBALFOUNDRIES Inc., Ugland House (KY)

(72) Inventors: Oleg Gluschenkov, Tannersville, NY (US); Zuoguang Liu, Schenectady, NY (US); Shogo Mochizuki, Clifton Park, NY (US); Hiroaki Niimi, Cohoes, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/004,756

(22) Filed: Jan. 22, 2016

(65) Prior Publication Data

US 2017/0213889 A1    Jul. 27, 2017

(51) Int. Cl.
*H01L 29/08*    (2006.01)
*H01L 29/161*    (2006.01)
(Continued)

(52) U.S. Cl.
CPC .... *H01L 29/0847* (2013.01); *H01L 21/02057* (2013.01); *H01L 21/02532* (2013.01);
(Continued)

(58) Field of Classification Search
CPC ........ H01L 21/823814; H01L 29/66636; H01L 21/28518
See application file for complete search history.

(56) References Cited

U.S. PATENT DOCUMENTS

| | | |
|---|---|---|
| 5,668,402 A | 9/1997 | Mochizuki et al. |
| 7,718,500 B2 | 5/2010 | Chong et al. |

(Continued)

OTHER PUBLICATIONS

C.N. Ni, et al., "Ultra-low contact resistivity with highly doped Si: P contact for nMOSFET," Symposium on VLSI Technology Jun. 2015, pp. T118-T119.

(Continued)

*Primary Examiner* — Lex Malsawma
*Assistant Examiner* — Xia Cross
(74) *Attorney, Agent, or Firm* — Vazken Alexanian; Michael J. Chang, LLC

(57) ABSTRACT

Techniques for forming Ga-doped source drain contacts in Ge-based transistors are provided. In one aspect, a method for forming Ga-doped source and drain contacts includes the steps of: depositing a dielectric over a transistor; depositing a dielectric over the transistor; forming contact trenches in the dielectric over, and extending down to, source and drain regions of the transistor; depositing an epitaxial material into the contact trenches; implanting gallium ions into the epitaxial material to form an amorphous gallium-doped layer; and annealing the amorphous gallium-doped layer under conditions sufficient to form a crystalline gallium-doped layer having a homogenous gallium concentration of greater than about $5\times10^{20}$ at./cm$^3$. Transistor devices are also provided utilizing the present Ga-doped source and drain contacts.

16 Claims, 4 Drawing Sheets

(51) Int. Cl.

| | | |
|---|---|---|
| H01L 29/167 | (2006.01) | |
| H01L 29/417 | (2006.01) | |
| H01L 21/324 | (2006.01) | |
| H01L 21/02 | (2006.01) | |
| H01L 21/265 | (2006.01) | |
| H01L 29/45 | (2006.01) | |
| H01L 29/66 | (2006.01) | |
| H01L 29/165 | (2006.01) | |
| H01L 29/78 | (2006.01) | |
| H01L 21/285 | (2006.01) | |
| H01L 21/8238 | (2006.01) | |

(52) U.S. Cl.
CPC .. *H01L 21/02592* (2013.01); *H01L 21/26513* (2013.01); *H01L 21/28518* (2013.01); *H01L 21/324* (2013.01); *H01L 21/823814* (2013.01); *H01L 29/161* (2013.01); *H01L 29/165* (2013.01); *H01L 29/167* (2013.01); *H01L 29/41725* (2013.01); *H01L 29/45* (2013.01); *H01L 29/665* (2013.01); *H01L 29/66636* (2013.01); *H01L 29/7848* (2013.01)

(56) References Cited

U.S. PATENT DOCUMENTS

| | | |
|---|---|---|
| 9,059,096 B2 | 6/2015 | Guillorn et al. |
| 2005/0287799 A1 | 12/2005 | Lee et al. |
| 2007/0138570 A1* | 6/2007 | Chong ............ H01L 21/823807 257/371 |
| 2007/0224785 A1* | 9/2007 | Liu .................... H01L 21/2022 438/478 |
| 2012/0003799 A1* | 1/2012 | Kim .................. H01L 21/26506 438/233 |
| 2014/0346575 A1 | 11/2014 | Chen et al. |
| 2015/0035008 A1 | 2/2015 | Kittl et al. |
| 2015/0236117 A1* | 8/2015 | Kapoor ............... H01L 29/6659 257/336 |

OTHER PUBLICATIONS

H. Yu et al., "1.5×10-9 Ω•cm2 Contact Resistivity on Highly Doped Si:P Using Ge Pre-amorphization and Ti Silicidation," IEDM, Dec. 2015, 4 pages.

V. Heera et al., "Heavily Ga-doped germanium layers produced by ion implantation and flash lamp annealing: structure and electrical activation," Journal of Applied Physics, vol. 107, No. 5, Mar. 2010, 053508, 8 pages.

A. Dimoulas et al., "Fermi-level pinning and charge neutrality level in germanium," Applied Physics Letters, vol. 89, No. 25, Dec. 2006, 252110, 3 pages.

W.C. Dunlap Jr., "Diffusion of impurities in germanium," Physical Review, vol. 94, No. 6, Jun. 1954, pp. 1531-1540.

\* cited by examiner

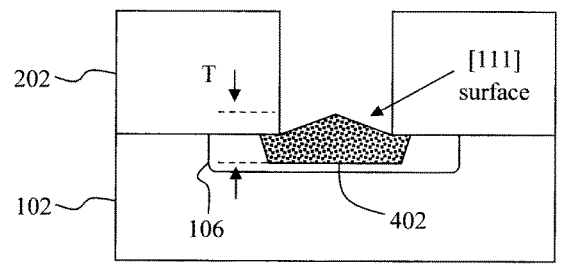
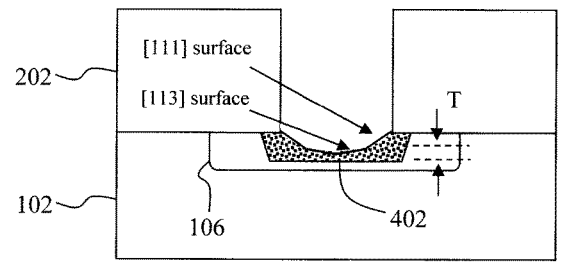
FIG. 4A                FIG. 4B
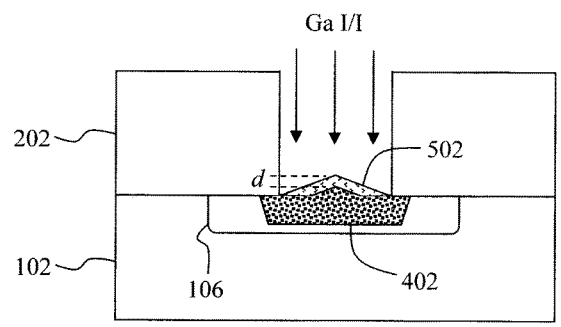
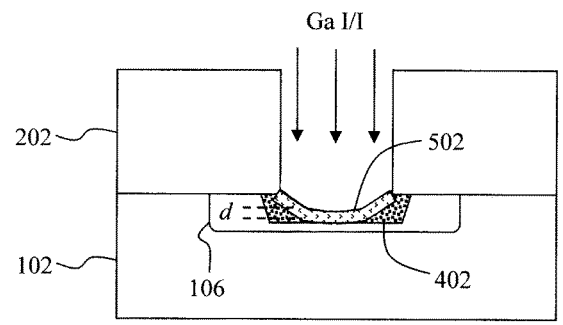
FIG. 5A                FIG. 5B
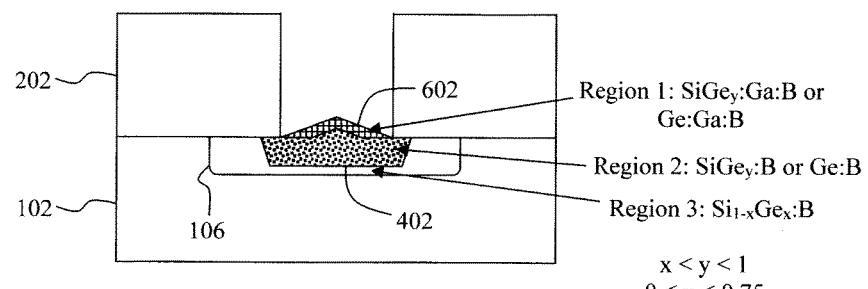
FIG. 6A

9,972,682 B2

LOW RESISTANCE SOURCE DRAIN CONTACT FORMATION

FIELD OF THE INVENTION

The present invention relates to low resistance source drain contacts in germanium (Ge)-based transistors, and more particularly, to techniques for forming gallium (Ga)-doped source drain contacts in Ge-based transistors using a rapid anneal to increase amounts of Ga above chemical stability concentrations and thereby greatly reduce contact resistance.

BACKGROUND OF THE INVENTION

Transistors typically include at least one gate over a channel region, and source and drain regions on opposite sides of a channel region, and at least one gate that regulates current flow through the channel. Contacts to the source and drain regions are often made by first forming a metal silicide on the base source drain material, then depositing a dielectric over the transistor, patterning contact trenches in the dielectric, and lastly forming metal source drain contacts in the contact trenches.

The contact resistance between the metal contacts and the source drain material is an important consideration. Dopant implantation can be used to reduce the contact resistance. Boron is common dopant for p-type transistors. Boron, however, has a low solubility in materials with a high Ge content. For example, boron has a solubility of about $5.5 \times 10^{18}$ at./cm$^3$ in pure germanium. A low solubility results in a higher contact resistance. Thus, boron is not an ideal dopant for Ge-based transistors.

Accordingly, improved techniques for source and drain contact formation in Ge-based transistors having reduced contact resistance would be desirable.

SUMMARY OF THE INVENTION

The present invention provides techniques for forming gallium (Ga)-doped source drain contacts in Ge-based transistors using a rapid anneal to increase amounts of Ga above chemical stability concentrations and thereby greatly reduce contact resistance. In one aspect of the invention, a method for forming Ga-doped p-type source and drain contacts is provided. The method includes the steps of: forming a transistor comprising source and drain regions interconnected by a channel region and at least one gate configured to regulate current flow through the channel region; depositing a dielectric over the transistor; forming contact trenches in the dielectric over, and extending down to, the source and drain regions; depositing an epitaxial material into the contact trenches; implanting gallium ions into the epitaxial material to form an amorphous gallium-doped layer; and annealing the amorphous gallium-doped layer under conditions sufficient to form a crystalline gallium-doped layer having a homogenous gallium concentration of greater than about $5 \times 10^{20}$ atoms per cubic centimeter (at./cm$^3$).

In another aspect of the invention, a device is provided that includes: a p-type transistor comprising source and drain regions interconnected by a channel region, and at least one gate configured to regulate current flow through the channel region; a dielectric over the p-type transistor; contact trenches present in the dielectric over, and extending down to, the source and drain regions; an epitaxial material within the contact trenches; and a crystalline gallium-doped layer on the epitaxial material having a homogenous gallium concentration of greater than about $5 \times 10^{20}$ at./cm$^3$.

In yet another aspect of the invention, another device is provided that includes: a p-type transistor comprising source and drain regions interconnected by a channel region, and at least one gate configured to regulate current flow through the channel region; a dielectric over the p-type transistor; contact trenches present in the dielectric over, and extending down to, the source and drain regions; and a crystalline gallium-doped layer in direct contact with the source and drain regions, wherein the crystalline gallium-doped layer has a homogenous gallium concentration of greater than about $5 \times 10^{20}$ at./cm$^3$.

A more complete understanding of the present invention, as well as further features and advantages of the present invention, will be obtained by reference to the following detailed description and drawings.

BRIEF DESCRIPTION OF THE DRAWINGS

FIG. 4A is a cross-sectional diagram illustrating an epitaxial growth process having been used to deposit a germanium (Ge)-containing epitaxial material in the contact trenches having a raised hat faceted structure according to an embodiment of the present invention;

FIG. 4B is a cross-sectional diagram illustrating the Ge-containing epitaxial material having been formed in the contact trenches having a depressed faceted structure according to an embodiment of the present invention;

FIG. 5A is a cross-sectional diagram illustrating an ion implant of gallium (Ga) having been performed into the epitaxial material forming a Ga-doped amorphous layer in the raised hat faceted epitaxial material according to an embodiment of the present invention;

FIG. 5B is a cross-sectional diagram illustrating the Ga ion implant having been performed into the epitaxial material forming a Ga-doped amorphous layer in the depressed faceted epitaxial material according to an embodiment of the present invention;

FIG. 6A is a cross-sectional diagram illustrating a rapid annealing process having been used to re-crystallize the amorphous layer forming a Ga-doped crystalline layer in the raised hat faceted epitaxial material according to an embodiment of the present invention;

DETAILED DESCRIPTION OF PREFERRED EMBODIMENTS

Provided herein are techniques for forming Ga-doped p-type source and drain contacts. The present techniques may be used in conjunction with those described in U.S. patent application Ser. No. 15/004,751, entitled "Low Resistance Source Drain Contact Formation With Trench Metastable Alloys and Laser Annealing," the contents of which are incorporated by reference as if fully set forth herein.

As compared to conventional p-type dopants such as boron (see above), Ga has a high solubility in Ge. For instance, the solubility of Ga in pure Ge is about $5.0 \times 10^{20}$ atoms per cubic centimeter (at./cm$^3$) in pure Ge. See, for example, C. Claeys et al., "*Germanium-Based Technologies: From Materials to Devices,*" Elsevier, New York p. 338 (2007), the contents of which are incorporated by reference as if fully set forth herein.

Advantageously, by way of a rapid re-crystallization annealing process, the present techniques may be employed to increase the Ga content above a chemical solubility limit, while maintaining homogeneous Ge:Ga material. This resulted in decreasing the contact resistance while generally adding dopant in excess of its chemical solubility limit. Namely, when creating a (semiconductor-dopant) alloy such as a GeGa alloy, there is limit beyond which a chemically homogeneous material (i.e., where the concentration of the dopant, e.g., Ga, is uniform throughout the material) generally cannot be formed. Above this limit, the dopant tends to form precipitates and clusters. Precipitated or clusterized dopants do not contribute to electrical conduction. However, it has been found herein that an ion implant to first create a pocketed, amorphous Ga layer, followed by a rapid re-crystallization annealing process can be used to increase the Ga concentration significantly above the chemical stability limit, without precipitate formation and with a positive effect onto contact resistance. Without being bound by any particular theory, it is thought that the present rapid annealing process serves to quickly re-crystallize the pocketed, small-volume amorphous material, but does not allow the atoms to move around enough to form cluster or precipitates that are thermodynamically-favored, thereby avoiding any precipitation from occurring.

Figure 1:
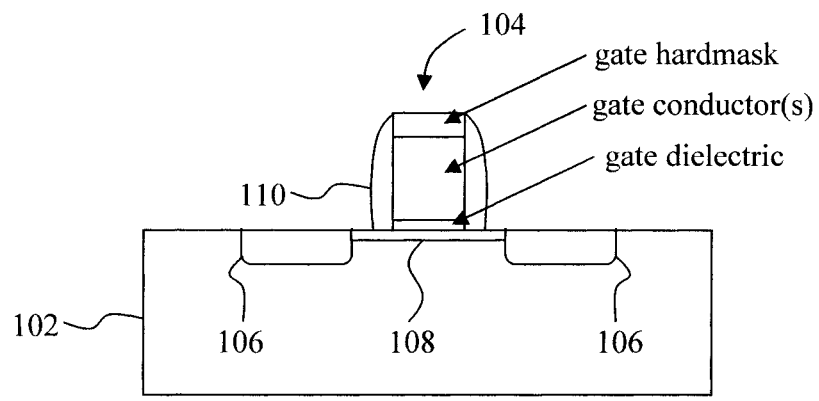
FIG. 1 is a cross-sectional diagram illustrating a transistor having been formed on a substrate, the transistor including source and drains regions interconnected by a channel region, and a gate stack which regulates current flow through the channel region according to an embodiment of the present invention.

The present techniques address formation of the Ga-doped p-type source and drain contacts. The process leading up to the source and drain contact formation can be performed in a variety of different ways. Generally, as shown in FIG. 1, the process begins with a substrate 102, a gate stack 104, on the substrate 102, and source drain regions 106 on opposite sides of the gate stack 104. As provided above, the gate stack regulates current flow in a channel region 108 between the source drain regions 106.

The substrate 102 can have a number of different configurations. By way of example only, the substrate 102 can be a bulk semiconductor (silicon (Si), germanium (Ge), silicon germanium (SiGe), III-V, etc.) substrate, or a semiconductor on insulator (SOI) substrate. As is known in the art, an SOI substrate includes a SOI layer (e.g., Si, Ge, SiGe, III-V, etc.) separated from a handle substrate (e.g., a Si substrate) by a buried insulator. When the buried insulator is an oxide, it is often referred to as a buried oxide. In the present figures, these different substrate configurations are represented generically by substrate 102. The substrate 102 is then cut or shaped into isolated active area regions where individual transistors will be formed. FIG. 1 shows an exemplary planar active region without explicitly showing isolation regions. While aspects of the exemplary embodiment are shown and described with respect to a planar p-type field-effect transistor (pFET), it is to be understood that aspects of the present techniques may be employed with different geometrical orientations and shapes of transistor active region or its channel such as, FINFET, surround-gate FETs, multiple-gate FETs, nano-wire or nano-sheet FETs, and vertical FETs.

The gate stack 104 can be formed on the substrate 102 using a number of different processes. For instance, either a gate-first, or a gate-last process can be employed. With a gate-last approach, a sacrificial (or dummy) gate serves as a placeholder for the final gate stack 104. This permits the formation of spacers 110 and/or placement of the source and drain regions 106 on opposite sides of the gate stack. After which, the dummy gate can be replaced with the final gate stack. Advantageously, the use of a gate-last approach avoids exposing the gate stack 102 to potentially damaging processing conditions, such as elevated temperatures, since the final device gate is placed at the end of the process. A suitable dummy gate material includes, but is not limited to, poly-silicon (poly-Si). By contrast, in a gate-first process, the gate stack 102 is formed early on in the process, and spacers 110, source and drain regions 106, etc. are placed on opposite sides of the gate stack 102.

Thus, in the figures, the gate stack formed by any of these processes is generically represented by gate stack 104. As shown in FIG. 1, according to an exemplary embodiment, the gate stack 102 shown in FIG. 1 can include a gate dielectric, a gate conductor(s), and (optionally) a gate hardmask. Suitable gate conductors include, but are not limited to, doped poly-Si and/or a metal or combination of metals. The gate dielectric can vary depending on the gate conductor. For instance, silicon dioxide (SiO$_2$) is a suitable gate dielectric for a poly-Si gate, whereas hafnium oxide (HfO$_2$) or lanthanum oxide (La$_2$O$_3$) are suitable gate dielectrics for a metal gate. According to one exemplary embodiment, the gate is a metal gate, and the gate conductor is composed of a workfunction setting metal layer on the gate dielectric, and a filler gate metal layer on the workfunction setting metal layer. Suitable n-type workfunction setting metals include, but are not limited to, titanium nitride (TiN), titanium carbide (TiC), and tantalum nitride (TaN). Suitable p-type workfunction setting metals include, but are not limited to, TiN, titanium aluminum (TiAl), and tungsten (W). Suitable filler gate metals include, but are not limited to, tungsten (W), cobalt (Co), copper (Cu), aluminum (Al), and alloys thereof.

The description that follows will focus on the formation of source and drain contacts. Thus, the figures depicting this process will illustrate an enlarged view of the source and drain regions 106 of the transistor. According to an exemplary embodiment, the source/drain semiconductor material 106 includes a Ge-containing semiconductor doped with boron (B). By way of example only, the source/drain semiconductor material 106 includes B-doped SiGe, i.e., $Si_{1-x}Ge_x$:B. According to an exemplary embodiment $0 \leq x \leq 0.75$. The concentration of chemical B in the layer 106 is from about $2 \times 10^{20}$ at./cm$^3$ to about $2 \times 10^{21}$ at./cm$^3$, and ranges therebetween, with an active concentration of B of from about $1 \times 10^{20}$ to about $1 \times 10^{21}$ at./cm$^3$, and ranges therebetween. The boron may be introduced during the epitaxial growth (in-situ) or after via standard implantation and annealing techniques (ex-situ). This choice of SiGe source/drain material leads to a high conductivity within source/drain regions of a p-type transistor.

Figure 2:
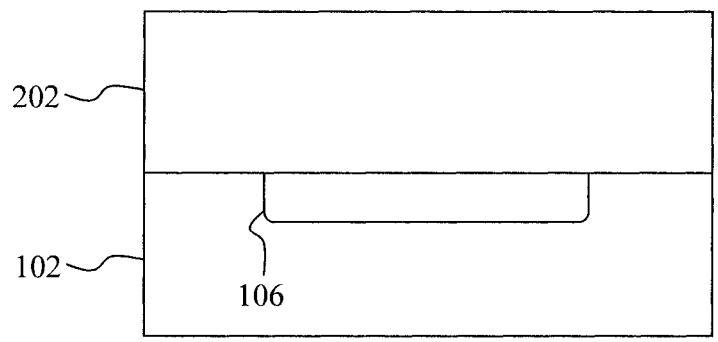
FIG. 2 is a cross-sectional diagram illustrating a dielectric having been deposited onto the transistor, covering the source and drain regions, according to an embodiment of the present invention.

A first exemplary embodiment is now described way of reference to FIGS. 2-8. The description that follows will focus on the formation of source and drain contacts. Thus, the figures depicting this process will illustrate an enlarged view of the source and drain regions 106 of the transistor. For instance, as shown in FIG. 2, following formation of the gate stack 104, gate spacers 110, and source and drain regions 106, the device is covered in a dielectric 202. Standard interlayer dielectrics (ILD) may be used in the present process.

Figure 3:
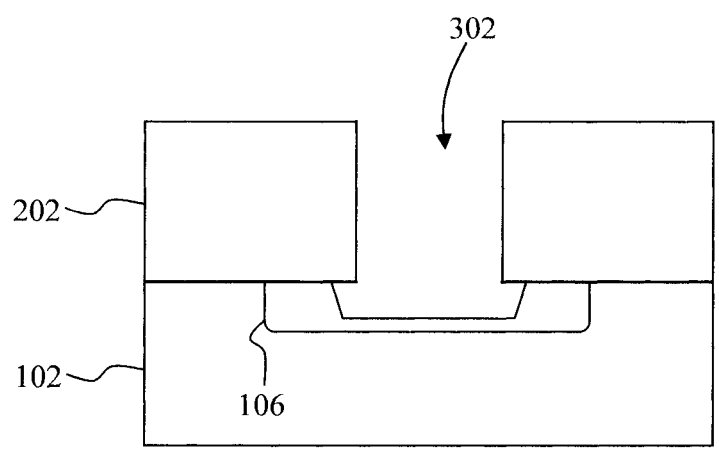
FIG. 3 is a cross-sectional diagram illustrating contact trenches having been formed in the dielectric over, and extending down to, the source and drain regions, preferably followed by a surface cleaning process according to an embodiment of the present invention.

Next, as shown in FIG. 3, contact trenches 302 are formed in the dielectric 202 over, and extending down to, the source and drain regions 106. While only a single source and drain region 106/contact trench 302 is shown in the figures, it is to be understood that the same processes would be performed on the source and drain region 106 opposite the other side of the gate stack 104. Contact trenches may be formed using an anisotropic etching process such as reactive ion etching (RIE). The size of the contact openings 302 varies in accordance with the technology node and is typically less than 20 nanometer (nm) for technology nodes of 14 nm or less. It is to be understood that the small contact size results in a large semiconductor-metal contact resistance due to small current-crossing area while, on the other hand, progressively smaller contacts are required to enable smaller transistors and denser circuits. It is due to this reason that numerous teachings are present in the art directed toward creating a metallic layer (e.g., a silicide layer) over the entire source/drain regions 106 prior to forming contact openings. Contrary to those teachings, the semiconductor-metal contact in this case will be created within the small trench opening. It was found herein that the small contact opening provides an advantage for further stabilizing metastable semiconductor-dopant alloys formed within the trenches.

Using a plasma etch such as RIE leaves surface damage and polymeric residue. Thus, it is preferable, following the trench etch, to clean the exposed surfaces of the substrate 102 at the bottom of contact trenches 302. Suitable cleaning processes include, but are not limited to, a surface treatment with dry or wet processes with hydrogen fluoride (HF), nitrogen trifluoride (NF$_3$), hydrogen chloride (HCl), and mixtures thereof. Despite the cleaning process, some of the foreign atoms, namely, carbon and/or oxygen, from the residue may remain trapped at the surface and within the defects interfering with subsequent processing steps and electrical current conduction. We note that both RIE and surface postcleaning may develop a faceted depression in the crystalline source/drain material 106. The crystalline surfaces of the depression may include [111]- and [113]-oriented facets.

As shown in FIG. 4, an epitaxial growth process is then used to deposit a trench contact epitaxial material 402 in the contact trenches 302. The purpose of this step is two-fold: (1) to reconstruct damaged semiconductor surface creating clean and ordered semiconducting material and (2) to adjust the semiconductor material composition for minimizing Schottky barrier height at the semiconductor-metal interface. Lower Schottky barrier height leads to a reduced contact resistivity of the interface. Typically, a metal contact to p-type semiconductors is particular challenging due to a relatively large Schottky barrier height for most metallic materials. One exception is germanium that exhibits metal Fermi level pinning to near its valence band yielding a low Schottky barrier height to p-type germanium for most metallic materials. Accordingly, pure germanium is a preferred epitaxial material 402 for contacts to p-type transistors. The shape of the epitaxial material 402 depends on its target thickness T and its relationship to the trench opening. For thicknesses T substantially smaller than the trench opening, the layer 402 conformally grows on the crystalline facets of source/drain material 106. As the epitaxial growth progresses, the epitaxial material 402 can develop a raised 'hat' structure with [111]-oriented facets, as shown in FIG. 4A. Advantageously, the top surface of epitaxial material 402 is maximized for lower contact resistance. Accordingly, both a raised "hat" and depressed (see FIG. 4B) faceted structures are preferred over a flat top surface. The depressed faceted structure of epitaxial material 402 for a target thickness T of less than the trench opening and from about 5 nm to about 15 nm, and ranges therebetween, is preferred due to a small resultant volume and an increased surface area of epitaxial material 402. Thus, for illustrative purposes, the process will be illustrated in the figures for both raised hat (version A) and depressed (version B) faceted structures.

According to an exemplary embodiment, the source/drain semiconductor material 106 includes a Ge-containing semiconductor doped with boron (B). By way of example only, the source/drain semiconductor material 106 contains about 50% germanium (e.g., SiGe$_x$ with 50% Ge and 50% Si or x=0.5). As alluded above, the source/drain material 106 can be boron-doped SiGe (i.e., SiGe$_x$:B) with boron introduced during the epitaxial growth (in-situ) or after via standard implantation techniques (ex-situ). The concentration of chemical B in source/drain material 106 is from about $2 \times 10^{20}$ at./cm$^3$ to about $2 \times 10^{21}$ at./cm$^3$, and ranges therebetween, with an active concentration of B of from about $1 \times 10^{20}$ at./cm$^3$ to about $1 \times 10^{21}$ at./cm$^3$, and ranges therebetween. By way of example only, the epitaxial material 402 can be pure germanium. The exemplary epitaxial material 402 can be optionally doped with boron during growth using in-situ or ex-situ techniques but the active concentration of B is limited to less than about $5 \times 10^{19}$ at./cm$^3$ for pure Ge. The preferred technique of growing exemplary epitaxial material 402 is a chemical vapor deposition (CVD) with suitable Ge precursors including but not limited to germane GeH$_4$ and digermane Ge$_2$H$_6$. By way of example only, the CVD growth conditions may include a deposition temperature of from about 400 degrees Celsius (° C.) to about 500° C. (upper temperature range is limited by compatibility with the gate stack material), and ranges therebetween, and a process pressure of from about 5 Torr to about 600 Torr, and ranges therebetween. We note that while exemplary epitaxial material 402 is preferably pure Ge, a high-percent Ge SiGe (SiGe$_y$, wherein $0.8 < y \leq 1$) can also be used. For such a high-percent-Ge SiGe layer, the concentration of Ge within the layer of material 402 can be graded with a lower concentration toward source/drain material 106 and higher concentration toward the surface. Alternative fabrication techniques can be used for forming graded high-percent Ge layer 402. One such technique is the Ge surface segregation from partially molten SiGe where a surface portion of SiGe material 106 is subjected to rapid melting and re-crystallization.

As provided above, the present techniques employ Ga in the source and drain contacts. In the instant example, an amorphizing implant is first used to form a pocketed amorphous layer of Ga-doped pure Ge or high-percent Ge (SiGe$_y$) followed by a rapid laser anneal to re-crystallize the material. However, as provided above, the anneal is so fast that it does not allow Ga atoms to form clusters or precipitates despite their high concentration, in the excess of its chemical solubility limit in pure Ge. As a result, a homogeneous metastable GeGa alloy can be formed even at Ga concentrations above that which are chemically stable. Such homogeneous GeGa alloys exhibit a metallic-type electrical conductivity of highly-degenerate p-type semiconductor with its Fermi level close to the valence band of pure Ge.

Specifically, as shown in FIG. 5, an amorphizing, pocketed ion implant (I/I) of Ga is performed into the epitaxial material 402 forming a Ga-doped amorphous layer or pocket 502 in the epitaxial material 402. As provided above, the epitaxial material 402 can include high-percent SiGe (with at least 80% Ge) up to pure Ge. In that case, amorphous pocket 502 would include Ga-doped SiGe up to Ga-doped Ge, respectively. Alternatively, Ga may be introduced fully or partially during epitaxial growth of layer 402 (in-situ) using a suitable Ga gas source including, but are not limited to, trimethylgallium (Ga(CH$_3$)$_3$) and/or triethylgallium ((CH$_3$CH$_2$)$_3$Ga). Due to a relatively high growth temperature of from about 400° C. to about 500° C., and ranges therebetween, with sufficient duration, the excess Ga atoms are free to form clusters and precipitates in as-grown layer 402. An amorphizing, pocketed ion implant (I/I) will be useful to intentionally destroy Ga clusters forming homogeneous Ga-doped amorphous pocket 502. In this case, the amorphizing implantation can be accomplished through any large, neutral ion including but not limited to Ge, Si, xenon (Xe), or argon (Ar) ions, however, performing amorphization via Ga ion implantation is still preferred because it allows for adding extra Ga atoms into pocket 502. The implantation conditions are selected to achieve a target concentration of Ga atoms throughout the pocket 502 and a target depth d of pocket 502.

The depth d of pocket 502 is preferably close to the thickness T of layer 402 distributing Ga atoms up to the layer 106 but not in the excess amount within layer 106. An excess amount of Ga in layer 106 is not desirable because Ga solid solubility is much lower within layer 106 than layer 402 resulting in forming Ga precipitates in layer 106 at later processing steps. By way of example only, the Ga ion implantation conditions may include zero ion tilt (vertical implant), an ion energy of from about 0.5 kilo-electron volt (keV) to about 10 keV, and ranges therebetween, an ion dose of from about $1\times10^{15}$ cm$^{-2}$ to about $1\times10^{16}$ cm$^{-2}$, and ranges therebetween, and a substrate implantation temperature of from about −150° C. (cryor implantations) to about 80° C., and ranges therebetween. FIGS. 5A and 5B illustrate formation of the Ga-doped amorphous layer or pocket 502 with raised hat and depressed faceted structures, respectively. Further, FIG. 5B illustrates the exemplary scenario where the depth d of pocket 502 is equivalent to the thickness T of layer 402 (compare, e.g., FIG. 4B and FIG. 5B). While not explicitly shown, the same configuration can be achieved with the raised hat configuration of FIG. 5A by increasing the depth d of pocket 502.

According to an exemplary embodiment, a high concentration of Ga is implanted into the epitaxial material 402 in this step. Further, as found herein, increasing the Ga concentration in the excess of its chemical solubility limit decreases the contact resistance. Thus, preferably, Ga concentrations are implemented in this step which are greater than the chemical solubility limit. By way of example only, the Ga concentration employed in this step is greater than about $5\times10^{20}$ at./cm$^3$, e.g., from about $6\times10^{20}$ at./cm$^3$ (or 1.4 atomic percent, at. %) to about $8\times10^{21}$ at./cm$^3$, (or 18 at. %), and ranges therebetween. According to an exemplary embodiment, the depth d of pocket 502 is from about 5 nanometers (nm) to about 15 nm, and ranges therebetween.

Figure 6B:
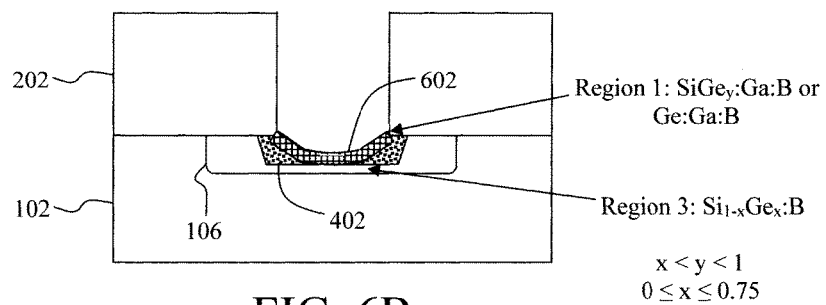
FIG. 6B is a cross-sectional diagram illustrating the Ga-doped crystalline layer having been formed in the depressed faceted epitaxial material according to an embodiment of the present invention.

Next, a rapid annealing process is used to re-crystallize the Ga-doped amorphous pocket 502 forming a Ga-doped crystalline layer 602 in the epitaxial material 402. See FIG. 6. However, the anneal is performed so fast that it does not allow the Ga atoms to move around enough to form Ga clusters and precipitates that are thermodynamically-favored, thereby avoiding any precipitation from occurring. Thus, according to an exemplary embodiment, the anneal is performed under conditions (see below) sufficient to form a gallium-doped crystalline layer in the epitaxial material 402 having a homogenous Ga concentration that is greater than about $5\times10^{20}$ at./cm$^3$, e.g., from about $6\times10^{20}$ at./cm$^3$ (or 1.4 atomic percent, at. %) to about $8\times10^{21}$ at./cm$^3$ (or 18 at. %), and ranges therebetween. Another way to look at it is, with conventional techniques, these high Ga concentrations would result in a non-homogeneous material due to precipitation of the components. For illustrative purposes only, a homogenous material in this context means absence of abrupt changes in concentration of its constituents, especially Ga, while allowing for gradual changes. Such homogenous material may be defined via comparing concentrations within small (e.g., 1 nm by 1 nm) adjacent cells of layer 602 such that Ga concentration difference between adjacent cells does not exceed 50%. The homogeneous property of layer 602 can be verified via a high-resolution transmission electron microscopy and related techniques. FIGS. 6A and 6B illustrate formation of the Ga-doped crystalline layer 602 with raised hat and depressed faceted structures, respectively.

This anneal can be performed in several different ways. For instance, according to one exemplary embodiment, a solid phase epitaxy (SPE) laser annealing process is used to anneal the amorphous layer 502 at temperature of from about 600° C. to about 800° C., and ranges therebetween, for a duration of from about 50 microseconds to about 5 milliseconds, and ranges therebetween. A triangular temperature-time laser spike annealing process can be used for this purpose. The preferred peak temperature for laser spike anneal process is from about 700° C. to about 800° C., and ranges therebetween, and preferred duration at 50 degrees below peak temperature is from about 50 microseconds to about 250 microseconds, and ranges therebetween. This can be performed using a millisecond laser annealer. According to another exemplary embodiment, a liquid phase epitaxy (LPE) laser annealing process is used to anneal the amorphous layer 502 above its melting point at a temperature of from about 750° C. to about 1,100° C., and ranges therebetween, for a duration of from about 10 nanoseconds to about 1,000 nanoseconds, and ranges therebetween. This can be performed using a nanosecond melt laser annealer. The SPE laser annealing has a slower rate of re-crystallization but does not allow any excessive movement of Ga atoms, while LPE laser annealing has a faster rate of re-crystallization but allows for redistribution of atoms in the molten phase. Faster re-crystallization rates may allow for sustaining higher concentration of Ga without precipitation. Ga atom redistribution in the molten phase may be advantageous to form a uniform concentration of Ga throughout the bulk of layer 602.

As provided above, the present techniques afford use of very high concentrations of Ga in the contact. For instance, based on the Ga dopant concentrations provided above, the crystalline layer 602 can have a Ga concentration of from about greater than about $5 \times 10^{20}$, e.g., about $6 \times 10^{20}$ at./cm$^3$ (or 1.4 atomic percent, at. %) to about $8 \times 10^{21}$ at./cm$^3$ (or 18 at. %), and ranges therebetween. Advantageously, the Ga concentration will be homogeneous throughout the crystalline layer 602. This is what is referred to herein as a metastable material. Once the metastable material is formed, it must be preserved by limiting the temperature and duration of subsequent processes. We note that while the metastable alloy is created late in the transistor processing sequence allowing for its preservation, the thermal budget of subsequent process steps shall be limited (discussed below).

Based on the above, FIG. 6 illustrates one exemplary configuration of the various regions of the contact structure. In this example, the layered contact structure includes at least three distinct regions (Region 1, Region 2, and Region 3). By way of example only, the first region (Region 1) is the crystalline layer 602 which in this case is formed from Ga and B doped high % Ge SiGe or Ge, i.e., SiGe$_x$:Ga:B or Ge:Ga:B, where boron presence is optional. By way of the present processing sequence, the crystalline layer 602 is doped with Ga, preferable at a high concentration—see above.

The second region (Region 2) is the epitaxial material 402 beneath the crystalline layer 602. As provided above, the epitaxial material 402 can be Ga and B doped high-percent Ge SiGe or Ge, i.e., SiGe$_y$:Ga:B or Ge:Ga:B, where boron presence is optional. The amount of Ga in this layer can be less than in the layer 602 to avoid excessive Ga precipitation but, nevertheless, shall be substantial to achieve a good electrical contact to the layer 106. The preferred Ga concentration in this region is from about $1 \times 10^{20}$ at./cm$^3$ to about $2 \times 10^{21}$ at./cm$^3$, and ranges therebetween. The presence of Ga in this region is due to Ga implant tail and an optional in-situ Ga doping during layer 402 epitaxy.

Beneath the epitaxial material 402 is the doped source and drain 106 portion of the substrate 102 which makes up the third region of the present layered contact structure. In this example, the source and drain region 106 includes B-doped SiGe, i.e., $Si_{1-x}Ge_x$:B. According to an exemplary embodiment $0 \leq x \leq 0.75$. The concentration of chemical B in the layer 106 is from about $2 \times 10^{20}$ at./cm$^3$ to about $2 \times 10^{21}$ at./cm$^3$, and ranges therebetween, with the active concentration of B being from about $1 \times 10^{20}$ at./cm$^3$ to about $1 \times 10^{21}$ at./cm$^3$, and ranges therebetween. The presence of excessive Ga in this region is not desirable because of a low solubility of Ga in layer 106 and likely Ga precipitation. The preferred Ga concentration in the bulk of layer 106 is therefore limited to less than about $1 \times 10^{20}$ at./cm$^3$, and to below about $5 \times 10^{20}$ at./cm$^3$ within 5 nm from the 402 interface.

In that case, the Ge content in Region 1 and Region 2 is greater than the Ge content in Region 3. Bringing Region 1 in direct contact with Region 3 (eliminating Region 2) may provide additional advantages for lowering contact resistance. This may be difficult to achieve with the implantation and laser SPE technique because bringing layer 502 in contact with layer 106 will place a large amount of Ga inside layer 106 that may cause Ga precipitation. However, nanosecond-scale laser-based LPE technique may allow for eliminating Region 2 making a direct contact between Regions 1 and 3 without placing excessive amount of Ga atoms inside layer 106. In this case, the temperature of laser LPE is selected to exceed melting points of both materials 502 and 402. In the case of pure Ge, the temperature of laser LPE shall exceed the melting point of crystalline Ge that is 940° C. Once the entire layer 402 melts, Ga atoms will quickly redistribute within the molten phase up to the interface with the solid material 106 that has a substantially higher melting point. Due to extremely short anneal time of laser-based LPE, Ga will not be able to penetrate into material 106. For illustrative purposes only, FIG. 6B illustrates the exemplary case where Region 1 is in direct contact with Region 3 (eliminating Region 2). As described above, this configuration can also be achieved with the raised hat design.

Figure 7A:
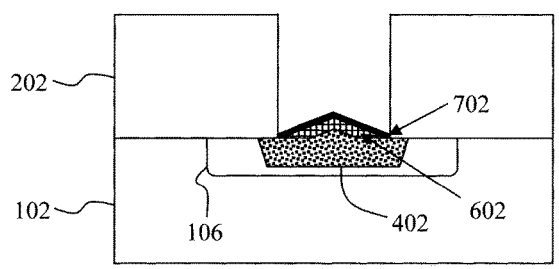
FIG. 7A is a cross-sectional diagram illustrating a metal silicide having been formed on the crystalline layer with a raised hat faceted structure according to an embodiment of the present invention.
Figure 7B:
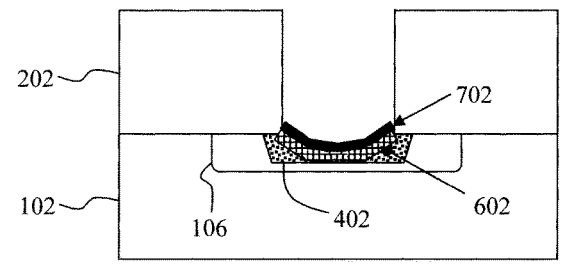
FIG. 7B is a cross-sectional diagram illustrating the metal silicide having been formed on the crystalline layer with the depressed faceted structure according to an embodiment of the present invention.

A metallic contact may next be formed on the crystalline layer 602. See FIG. 7. Metal silicide layer 702 can be formed by depositing a liner metal into the contact trench and then annealing the structure to react the silicide metal with the Ge (in crystalline layer 602) to form the silicide. An in-situ NF$_3$- or HF-base preclean may be performed prior to depositing the liner metal to remove any native oxide. Suitable silicide metals include, but are not limited to, titanium (Ti), and/or nickel (Ni), nickel-platinum (NiPt), cobalt (Co), aluminum (Al), lanthanum (La), yttrium (Y), erbium (Eb), and its alloys. A preferred metal liner structure is from about 1 nm to about 10 nm, and ranges therebetween, thick titanium (Ti) and followed by a from about 1 nm to about 5 nm, and ranges therebetween thick titanium nitride (TiN). The annealing is selected to preserve metastable alloy formed in prior steps. According to the exemplary embodiment, a millisecond laser spike annealing process can be used for this purpose. The preferred peak temperature for laser spike anneal process is from about 700° C. to about 800° C., and ranges therebetween, and preferred duration at 50 degrees below peak temperature is from about 50 microseconds to about 250 microseconds, and ranges therebetween. The laser annealing can be performed after metal line deposition or after forming metallic plug. The term 'silicide' refers generally herein to any product of reacting metal with a semiconductor even when the semiconductor is not silicon per se. For instance, when the starting semiconductor material is Ge, reference is still made herein to a 'silicide' with the understanding that the use of other terms is also possible such as 'germanide,' or 'germanosilicide' in the case of a SiGe starting material, etc. The silicide will form only where the silicide metal is in contact with the semiconductor (i.e., on the crystalline layer 602 at the bottom of the contact trenches 302). If the silicide forming anneal is performed after metal liner deposition, any unreacted metal can optionally be removed, e.g., using a wet etching process to free up more space for the metallic plug (i.e., contact metal 802—see below). Alternatively, unreacted metal liner may remain within the contact structure. FIGS. 7A and 7B illustrate formation of the metal silicide layer 702 with raised hat and depressed faceted structures, respectively.

Figure 8A:
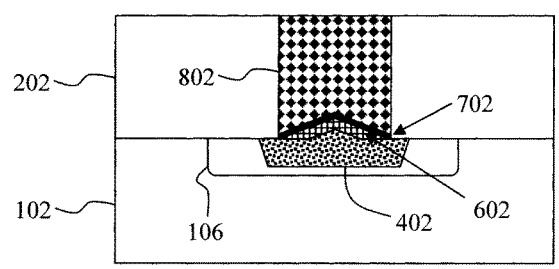
FIG. 8A is a cross-sectional diagram illustrating the contact trenches having been filled with a contact metal in accordance with the raised hat faceted structure according to an embodiment of the present invention.
Figure 8B:
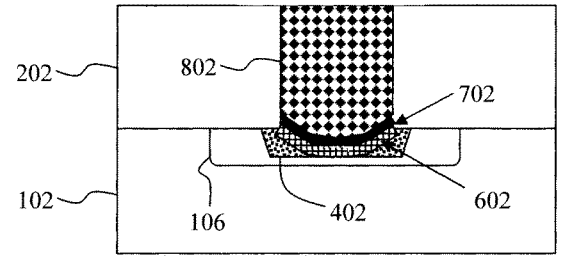
FIG. 8B is a cross-sectional diagram illustrating the contact trenches having been filled with a contact metal in accordance with the depressed faceted structure according to an embodiment of the present invention.

The contact trenches 302 can then be filled with a contact metal 802. See FIG. 8. Suitable contact metals include, but are not limited to, tungsten (W), cobalt (Co), and/or aluminum (Al). The excess metal is polished off using CMP forming a metallic plug structure. A standard back-end-of-the line (BEOL) metallization sequence forming contacts into desired circuit elements (not shown). FIGS. 8A and 8B illustrate the contact trenches 302 having been filled with the contact metal 802 in the case of raised hat and depressed faceted structures, respectively.

Referring to FIG. 8, the semiconductor 106 to metal 702 contact structure has several interfaces with associated contact resistances. The interface between layer 106 and layer 402 is known as a unipolar heterojunction while the interface between layer 702 and 602 is a classical semiconductor-silicide contact. In order to reduce overall contact resistance, the resistances of both interfaces must be low. Accordingly, a high concentration of Ga must be in the proximity of both interfaces. In addition, a high concentration of B must be in the proximity of unipolar heterojunction interface.

Figure 9:
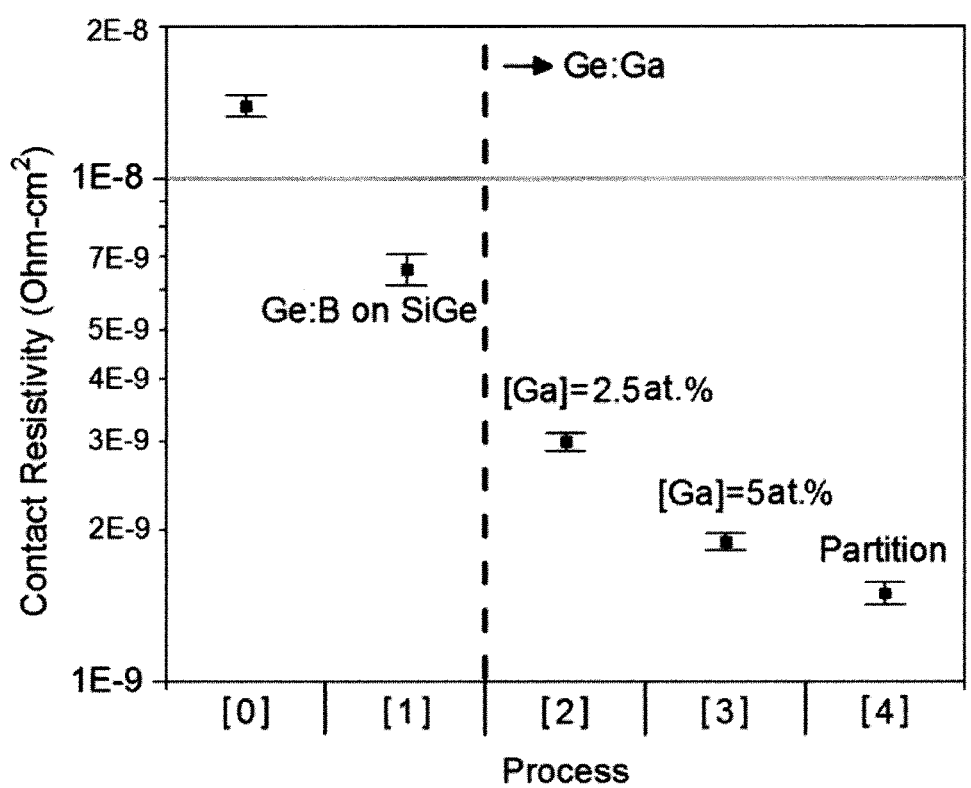
FIG. 9 is a diagram illustrating contact resistivity of samples prepared using with the present techniques according to an embodiment of the present invention.

The present techniques are further illustrated by way of reference to the following non-limiting example. According to the present techniques, the following contact structure was prepared: $Si_{0.5}Ge_{0.5}$:B followed by Ge:Ga with (2.5 and 5 atomic percent Ga) followed by a titanium based metallic film. Contact resistivity results for the sample are given in FIG. 9. As shown in FIG. 9, Ga doping decreases the contact resistivity as compared to B, and that greater concentrations of Ga translate to a lower contact resistivity.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming gallium-doped p-type source and drain contacts, the method comprising the steps of:
    forming a transistor comprising source and drain regions interconnected by a channel region and at least one gate configured to regulate current flow through the channel region;
    depositing a dielectric over the transistor;
    forming contact trenches in the dielectric over, and extending down to, the source and drain regions;
    depositing an epitaxial material into the contact trenches;
    implanting gallium ions into the epitaxial material to form an amorphous gallium-doped layer; and
    annealing the amorphous gallium-doped layer under conditions sufficient to form a crystalline gallium-doped layer having a homogenous gallium concentration of greater than about $5 \times 10^{20}$ atoms per cubic centimeter (at./cm$^3$),
    wherein the implanting further comprises performing a pocketed ion implant of the gallium ions into the epitaxial material whereby the gallium ions are implanted into only a portion of the epitaxial material such that the annealing produces a layered contact structure comprising three distinct regions including: a first region comprising the crystalline gallium-doped layer, a second region comprising the epitaxial material, and a third region comprising the source and drain regions, wherein the first region, the second region and the third region each comprises a germanium-containing semiconductor with the first region and the second region having a higher percentage of germanium than the third region, and wherein the first region has the homogenous gallium concentration of greater than about $5 \times 10^{20}$ at./cm$^3$.

2. The method of claim 1, further comprising the step of: performing a surface cleaning within the contact trenches.

3. The method of claim 1, wherein the source and drain regions comprise boron-doped silicon germanium.

4. The method of claim 1, wherein the epitaxial material comprises boron-doped silicon germanium.

5. The method of claim 1, wherein the epitaxial material comprises boron-doped germanium.

6. The method of claim 1, wherein the epitaxial material comprises gallium-doped germanium.

7. The method of claim 1, wherein the amorphous gallium-doped layer has a depth in the epitaxial material of from about 5 nanometers to about 10 nanometers, and ranges therebetween.

8. The method of claim 1, wherein the crystalline gallium-doped layer has a homogenous gallium concentration of from about $6 \times 10^{20}$ at./cm$^3$ to about $8 \times 10^{21}$ at./cm$^3$, and ranges therebetween.

9. The method of claim 1, wherein the conditions comprise a temperature and a duration.

10. The method of claim 9, wherein the annealing is performed using solid phase epitaxy laser annealing and wherein the temperature is from about 600° C. to about 800° C., and ranges therebetween, and the duration is from about 50 microseconds to about 5 milliseconds, and ranges therebetween.

11. The method of claim 9, wherein the annealing is performed using liquid phase epitaxy laser annealing and wherein the temperature is from about 750° C. to about 1,100° C., and ranges therebetween, and the duration is from about 10 nanoseconds to about 1,000 nanoseconds, and ranges therebetween.

12. The method of claim 1, further comprising the step of: forming a metal silicide on the crystalline gallium-doped layer.

13. The method of claim 1, further comprising the step of: filling the contact trenches with a contact metal.

14. The method of claim 13, wherein the contact metal comprises a metal selected from the group consisting of tungsten, cobalt, aluminum, and combinations thereof.

15. The method of claim 1, wherein the first region comprising the crystalline gallium-doped layer is directly in contact with the third region comprising the source and drain regions.

16. The method of claim 1, wherein the first region comprises gallium (Ga) and boron (B) doped silicon germanium (SiGe) (SiGe$_y$:Ga:B), the second region comprises SiGe$_y$:Ga:B, and the third region comprises $Si_{1-x}Ge_x$:B, wherein x<y<1, and wherein 0≤x≤0.75.

* * * * *